United States Patent [19]

Drekmeier

[11] Patent Number: 5,635,758
[45] Date of Patent: Jun. 3, 1997

[54] FILM IC WITH CONNECTION TERMINALS

[75] Inventor: Karl-Gerd Drekmeier, Unterhaching, Germany

[73] Assignee: Siemens Aktiengesellschaft, Munich, Germany

[21] Appl. No.: 426,221

[22] Filed: Apr. 21, 1995

[30] Foreign Application Priority Data

Sep. 21, 1994 [EP] European Pat. Off. ............ 94114867

[51] Int. Cl.⁶ .................................................. H01L 23/48
[52] U.S. Cl. ........................... 257/692; 257/690; 257/693; 257/696
[58] Field of Search ............................. 257/690, 692, 257/693, 696

[56] References Cited

U.S. PATENT DOCUMENTS

| 5,367,192 | 11/1994 | Massironi | 257/692 |
| 5,444,294 | 8/1995 | Suzuki | 257/692 |
| 5,444,299 | 8/1995 | Tsukada et al. | 257/692 |

FOREIGN PATENT DOCUMENTS

| 0148461 | 8/1988 | European Pat. Off. | |
| 4162554 | 6/1992 | Japan | 257/692 |

Primary Examiner—Mahshid D. Saadat
Assistant Examiner—Valencia Martin Wallace
Attorney, Agent, or Firm—Herbert L. Lerner; Laurence A. Greenberg

[57] ABSTRACT

A film integrated circuit includes at least one row of connection terminals to be connected in metallized holes of a given diameter formed in a printed circuit board. The connection terminals have a widened portion, one side with a pocket-like clamping contour to be connected to pads of a film IC, and another side to be connected to the printed circuit board and having a strip-like, comparatively narrower connection piece adjoining the widened portion. At least one of the connection pieces has a V-bend in a bending region forming a spring with one free arm and another arm being connected to the widened portion, for plug contacting in the holes formed in the printed circuit board. The V-bend has a bending radius being markedly smaller than the given diameter of a corresponding one of the holes formed in the printed circuit board. The bent connection pieces have a material thickness in the bending region being reduced by approximately 50%.

4 Claims, 2 Drawing Sheets

FILM IC WITH CONNECTION TERMINALS

BACKGROUND OF THE INVENTION

Field of the Invention

The invention relates to a film integrated circuit (IC) having at least one row of connection terminals for connection with metallized holes of a printed circuit board (PCB), the connection terminals have a pocket-like clamping contour on one side being connected to pads of the film IC and a striplike, comparatively narrower connection piece adjoining a widened portion on the other side for connection to the printed circuit board, and at least one of the connection pieces is bent in a V forming a spring with one free arm and one arm connected to the widened portion, for plug contacting in the holes of the printed circuit board, with a bending radius being markedly smaller than the diameter of the corresponding PCB hole.

One such film IC is known from European Patent 0 148 461 B1, the disclosure of which is incorporated by reference into the present patent application.

Film ICs of single-in-line or dual-in-line construction have leads with a cross section which is smaller by a factor of 10 than the circular area of the mounting holes in PCBs or similar circuit carriers. The known connection terminals which are bent in a V resiliently span that difference in cross section, thus providing a certain aid in stability. Problems arise, however, since the known stability aid has a rounded bending region, or in other words a rounded connection end. The result, as intended, is a connection end with an advantageously small introduction cross section for the PCB holes. However, the capability of introducing it into very small holes with a diameter of less than 1.0 mm is no longer ideally present. Above all, however, inserting the known aid to stability into such small holes undesirably requires strong insertion forces because of their construction, so that until now it was not recommended that the aid to stability be used.

Another problem arises when there are fewer pins (connection terminals bent in a V) than 5, since the plugged-in circuits can then be pushed out while being transported. The attempt has been made to increase the retention force by widening the opening of the V, but without complete success.

SUMMARY OF THE INVENTION

It is accordingly an object of the invention to provide a film integrated circuit with connection terminals, which is improved and which overcomes the hereinafore-mentioned disadvantages of the heretofore-known devices of this general type. With the foregoing and other objects in view there is provided, in accordance with the invention, a film integrated circuit, comprising at least one row of connection terminals to be connected in metallized holes of a given diameter formed in a printed circuit board; the connection terminals including a widened portion, one side with a pocket-like clamping contour to be connected to pads of a film IC, and another side to be connected to the printed circuit board and having a strip-like, comparatively narrower connection piece adjoining the widened portion; at least one of the connection pieces having a V-bend in a bending region forming a spring with one free arm and another arm being connected to the widened portion, for plug contacting in the holes formed in the printed circuit board, the V-bend having a bending radius being markedly smaller than the given diameter of a corresponding one of the holes formed in the printed circuit board; and the bent connection pieces having a material thickness in the bending region being reduced by approximately 50%.

In accordance with another feature of the invention, the connection piece has an inner bending radius of less than 0.1 mm and a correspondingly small outer radius tapering to a point.

In accordance with a further feature of the invention, the free arm has a rounded end region and an end pointing inward toward the other arm.

In accordance with a concomitant feature of the invention, the end region is bent inward and rounded far enough to cause the end of the free arm to be supported on the other arm.

Other features which are considered as characteristic for the invention are set forth in the appended claims.

Although the invention is illustrated and described herein as embodied in a film integrated circuit with connection terminals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
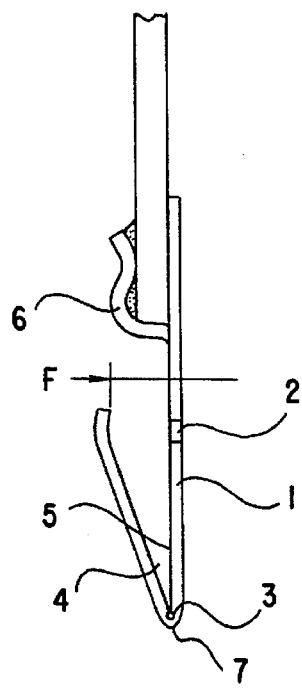
FIG. 1 is a fragmentary, diagrammatic, side-elevational view of a film IC with a connection terminal.

Referring now to the figures of the drawing in detail and first, particularly, to FIG. 1 thereof, there is seen a film IC soldered into a pocket-like clamping or terminal contour 6 that is part of a connection terminal. It can be seen that a material of a connection piece 1 having a V-bend 4 is thinned in a bending region 3 as compared with a widened portion 2 of a remainder of the connection piece 1 having a greater cross-sectional thickness. In the case of a tin film thickness 5 of more than 10 μm, which is created in immersion soldering of the clamping contours 6 or connection clips to the film IC in the region of the connection pins, an inner bending radius of less than 0.1 mm is possible because of the modified cross section. This creates such a small outer radius 7, which tapers to a point, that a desired aid in introduction and a low insertion force is possible, with PCB holes having a diameter of less than 1.0 mm.

Figure 2:
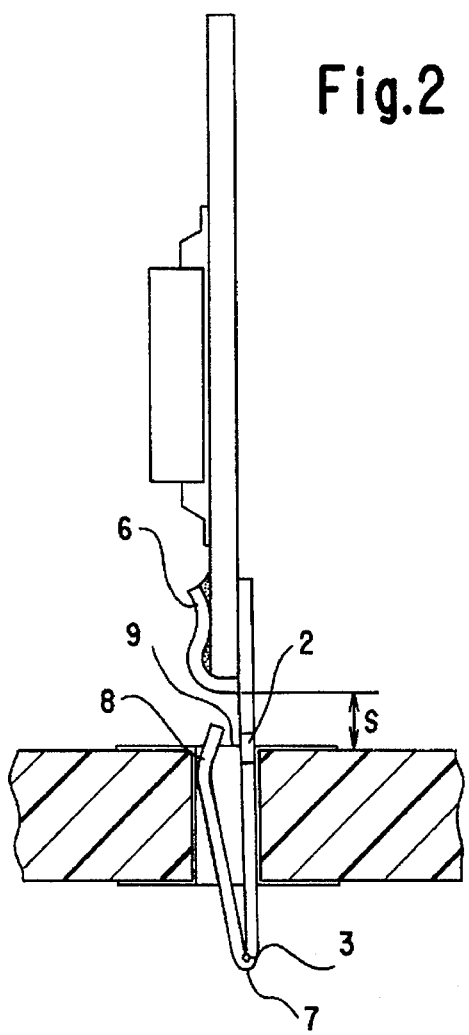
FIG. 2 is a fragmentary, side-elevational view of the connection terminal of FIG. 1 being inserted into a contact hole but unsoldered.

As FIG. 2 shows, the connection pieces 1 are inserted up to a standoff or spacing s into through-contacted PCB holes, which have a diameter of 0.9 mm, for instance, and which have a metallization indicated by a thick black line. A free arm of a spring of the connection piece 1 has an end region 8 which is shaped in rounded fashion on the inside, is located at a defined distance below an edge 9 of the hole and is thus a hindrance to the force of expulsion that would otherwise be a problem. In this position, transporting and flow soldering can be performed, without the circuit changing its position relative to the PCBs.

A deformation path f of the spring, which is indicated in FIG. 1, may be within the elastic material range. Repeated insertion, with the requisite criteria, thus becomes possible.

Figure 3:
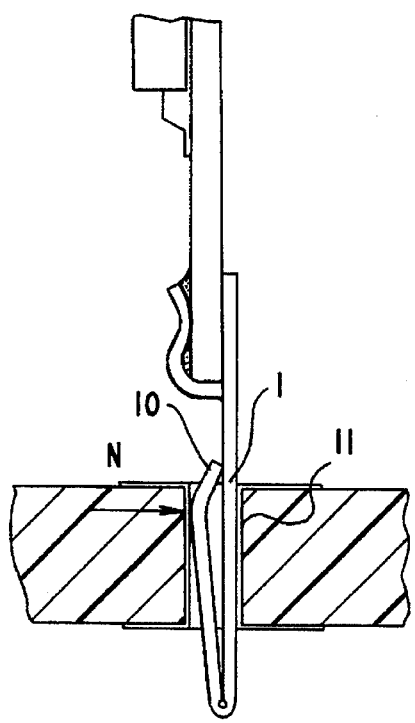
FIG. 3 is a fragmentary, side-elevational view of the version of FIG. 2 being inserted into a narrower contact hole.
Figure 4:
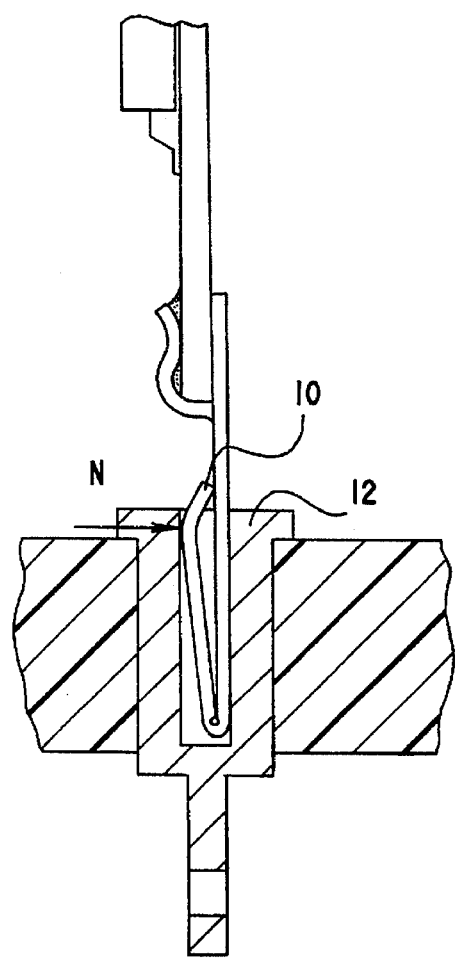
FIG. 4 is a fragmentary, side-elevational view of the version of FIG. 3 being inserted into a contact hole provided with a contact insert.

This fact permits repeated electrical contacting between the connection piece 1 and a PCB-through-contacting 11 or a contact insert 12, as FIGS. 3 and 4 show by way of example. A requisite contact force N is raised by a factor of approximately 10 by means of a support or bracing 10. The thus adequately contacted circuit can be soldered in place afterward for stability reasons without changing position.

Figure 5:
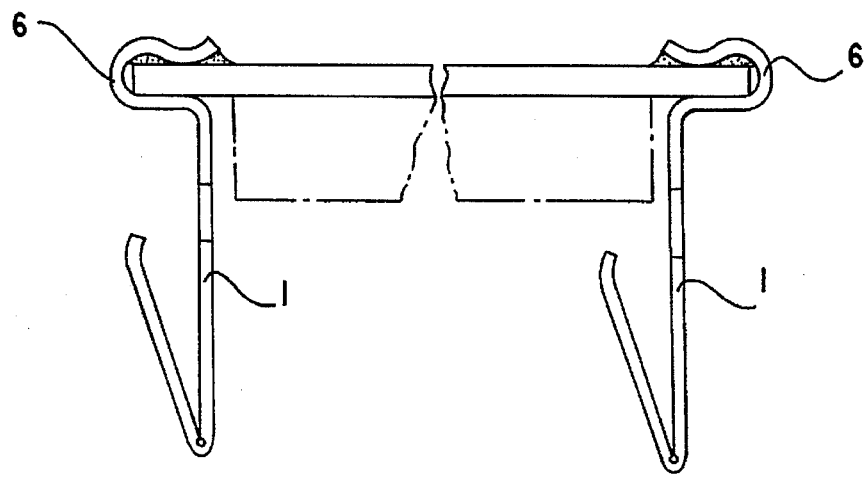
FIG. 5 is a side-elevational view of a film IC with two rows of connection terminals.

FIG. 5 shows a possible application of this invention to dual-in-line circuits for the sake of contacting as is shown in FIGS. 3 and 4, or of retention during transportation and soldering in PCBs.

I claim:

1. A film integrated circuit, comprising:

at least one row of connection terminals to be connected in metallized holes of a given diameter formed in a printed circuit board;

each of said connection terminals having a widened portion, a pocket-like clamping contour to be connected to pads of a film IC being mounted on one side of said widened portion, and a strip-like, comparatively narrower connection piece to be connected to the printed circuit board being mounted to another side of said widened portion;

at least one of said connection pieces having a V-bend in a bending region forming a spring with one free arm and another arm being connected to said widened portion, for plug contacting in the holes formed in the printed circuit board, said V-bend having a bending radius being markedly smaller than the given diameter of a corresponding one of the holes formed in the printed circuit board; and said bent connection pieces having a material thickness in said bending region being reduced by approximately 50%.

2. The film IC according to claim 1, wherein said connection piece has an inner bending radius of less than 0.1 mm and a correspondingly small outer radius tapering to a point.

3. The film IC according to claim 1, wherein said free arm has a rounded end region and an end pointing inward toward said other arm.

4. The film IC according to claim 3, wherein said end region is bent inward and rounded far enough to cause said end of said free arm to be supported on said other arm.

* * * * *